United States Patent [19]

Blossfeld

[11] Patent Number: 5,583,367

[45] Date of Patent: Dec. 10, 1996

[54] MONOLITHIC INTEGRATED SENSOR CIRCUIT IN CMOS TECHNOLOGY

[75] Inventor: Lothar Blossfeld, Freiburg/Hochdorf, Germany

[73] Assignee: Deutsche ITT Industries GmbH, Freiburg, Germany

[21] Appl. No.: 374,387

[22] Filed: Jan. 17, 1995

Related U.S. Application Data

[63] Continuation of Ser. No. 43,447, filed as PCT/EP92/01196, May 29, 1992, abandoned.

[30] Foreign Application Priority Data

Jun. 4, 1991 [DE] Germany .......................... 41 18 255.3

[51] Int. Cl.⁶ .......................... H01L 29/82; H01L 43/00
[52] U.S. Cl. .......................... 257/426; 257/350; 257/369
[58] Field of Search .................. 257/426, 427, 257/421, 653, 734, 784, 213, 226, 233, 234, 350, 351, 369, 371, 372

[56] References Cited

U.S. PATENT DOCUMENTS

| | | | |
|---|---|---|---|
| 4,549,088 | 10/1985 | Ozawa | 257/421 |
| 4,673,964 | 6/1987 | Popovic et al. | 257/427 |
| 4,780,625 | 10/1988 | Zobel . | |
| 4,782,375 | 11/1988 | Popovic | 257/427 |
| 4,929,993 | 5/1990 | Popovic | 257/426 |
| 4,987,467 | 1/1991 | Popovic | 257/427 |
| 5,095,349 | 3/1992 | Fujii et al. | 257/426 |

OTHER PUBLICATIONS

IEEE Journal of Solid–State Circuits Bd. 23, Nr. 5, Oktober 1988, New York US Seiten 1224–1232; 'Reduced Ground Bounce and Improved Latch–Up Suppression Through Substrate Conduction'.
Patent Abstracts of Japan vol. 7, No. 272 (E–214) (1417) 3. Dezember 1983 & JP,A,58 154 263 (Daini Seikosha K.K.) 13,–Sep. 1983.
Patent Abstracts of Japan vol. 7, No. 162 (E–187) (1307) 15, Juli 19883 & JP,A,58 070 564 (Hitachi Seisakusho K.K.) 27. Apr. 1983.
IEE Electro Bd. 7, Mai 1982, Los Angeles US Seiten 1–12; Nelson R, W.: 'Integrated Hall Sensors'.

*Primary Examiner*—Carl Whitehead, Jr.
*Attorney, Agent, or Firm*—Thomas L. Peterson

[57] ABSTRACT

The invention relates to a monolithic integrated sensor circuit, fabricated in CMOS technology, in which the circuit implemented on the semiconductor chip is connected to the ground connection via the substrate of the semiconductor chip, and in which the input signals are not referred to the potential of the ground connection.

3 Claims, 3 Drawing Sheets

5,583,367

MONOLITHIC INTEGRATED SENSOR CIRCUIT IN CMOS TECHNOLOGY

CROSS REFERENCE TO RELATED APPLICATIONS

This is a continuation of application Ser. No. 08/043,447 filed Apr. 2, 1993 now abandoned which is a CIP of PCT/EP92/01196 filed May 29, 1992.

The disclosure of the above-identified PCT application is hereby incorporated herein by reference.

Sensors in microelectronics are basically pickups which permit an indication of changes in the condition of technical systems such as those used in vehicles, for example. They serve as links between the analog world of temperature, pressure, acceleration, etc., as well as other physical variables and the digital world of processors which are now commonly used in vehicles. They are a major factor in determining the response speed of the electronics.

Sensors normally require an electronic circuit for evaluating signal voltages. Since the sensors, which may comprise a Hall generator, deliver only voltages of few mV or µV, amplifier circuits are used to boost such voltages before they are converted into digital values. Such amplifiers are commonly implemented in bipolar technology, which is superior to MOS technology as far as analog properties are concerned. Particularly at elevated temperatures, the use of CMOS technology has involved considerable problems, e.g., with respect to latch-up immunity. However, to be able to fabricate "more intelligent" sensors, it is desirable to integrate the sensor with a digital technology, that is, in CMOS technology. This is one object of the invention. Another object is to provide a sensor in CMOS technology for an extended temperature range from −50° to 190° centigrade. Another object is to protect the circuit against voltage spikes such as can be encountered in a vehicle's engine compartment where the sensor circuit may well be located.

These objects are attained by the present invention.

The present invention avoids latch-up, caused in a CMOS circuit by high temperatures, by applying a negative battery voltage via the back of the CMOS substrate, by connecting the substrate directly to ground, so that the substrate resistance is located between the ground connection of the circuit and the negative battery voltage. The voltage drop across this resistance renders any triggering of parasitic four-layer elements impossible.

Another advantage of the aspect of the invention is that the area commonly needed on the top side for the ground connection of the circuit is available for active components, so that a small chip size can be achieved. At the substrate resistance, however, switching pulses or switching currents occur, which react on the inputs. The solution according to the invention is therefore possible only in connection with input signals which are not referred to the potential of the ground connection. Such signal sources are the majority of sensors, such as Hall sensors, or symmetrical external signal sources, such as symmetrical ECL outputs.

Furthermore, reactions of the line outputs are possible directly via the substrate. To avoid this, separation of the ground leads of analog and digital subcircuits is suggested. To adjust the substrate resistance, e.g., to make it as small as possible, a low-resistivity substrate with a thin, high-resistivity epitaxial layer can be employed. To save chip area, the remainder of the scribe line at the edge of the chip can be used for making the connection to ground if particular circuit areas are to be grounded separately from the others.

To provide protection against static discharge, protective structures, such as PN zener diodes, or substrate PNP transistors are provided, which in this case are not connected to a metal interconnection on the chip but are interposed between the bonding pads or the supply lead and the ground connection.

Package, pressure, and temperature effects cause resistance changes and leakage currents which may strongly interfere with the operation of analog circuits or sensors. Therefore, to be able to utilize an extended temperature range, the sensors must be arranged axially symmetrically and protected against diagonal stress produced by the package, i.e., they must be compensated. A Hall generator, for example, is best positioned at the center of the chip. Similar requirements must be placed on the input stages of amplifiers. Also, metal or polysilicon interconnections, in conjunction with a plastic package, may exert pressure on the chip surface, which may lead to a malfunction of the sensor. Any crossing of such interconnections over input transistors or sensors should therefore be avoided, which is possible by a symmetrical arrangement of the same.

BRIEF DESCRIPTION OF THE DRAWINGS

The invention will now be explained in more detail with reference to the accompanying drawings, in which.

DETAILED DESCRIPTION

Figure 1:
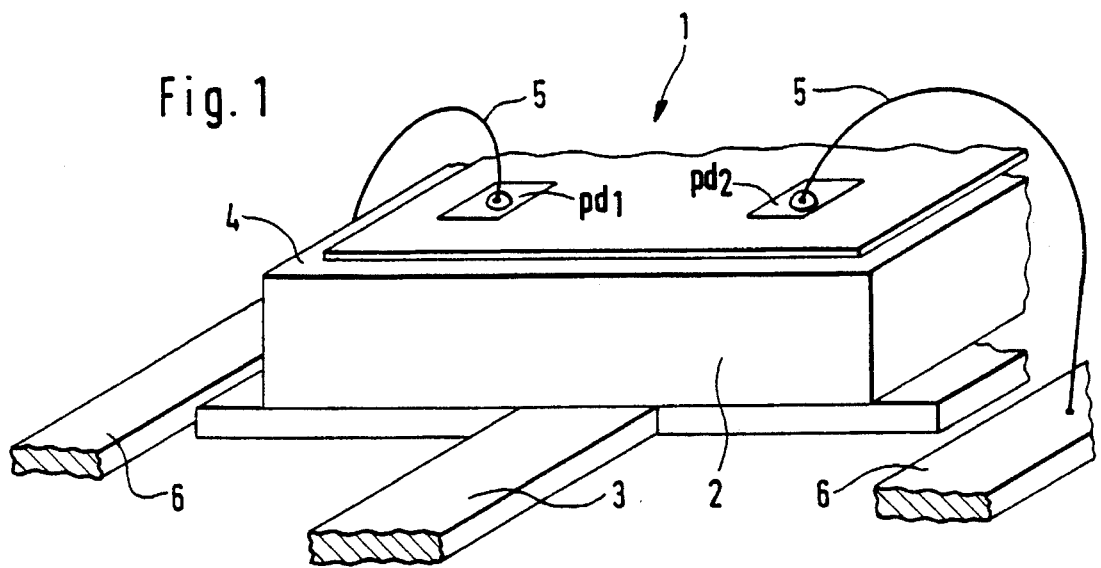
FIG. 1 is a schematic oblique view of a semiconductor chip arranged on and bonded to the corresponding parts of a lead frame.

FIG. 1 shows schematically the semiconductor chip 1, which has the back of its substrate conductively attached to a ground connection 3, and whose bonding pads $pd_1$ and $pd_2$ are connected by bonding wires 5 to the connecting strips 6. The circuit implemented on the substrate 2 is not shown to simplify the illustration. The remainder of the scribe line 4 at the chip edge can be used to ground isolated subcircuits, so that space is saved on the surface of the chip.

Figure 2:
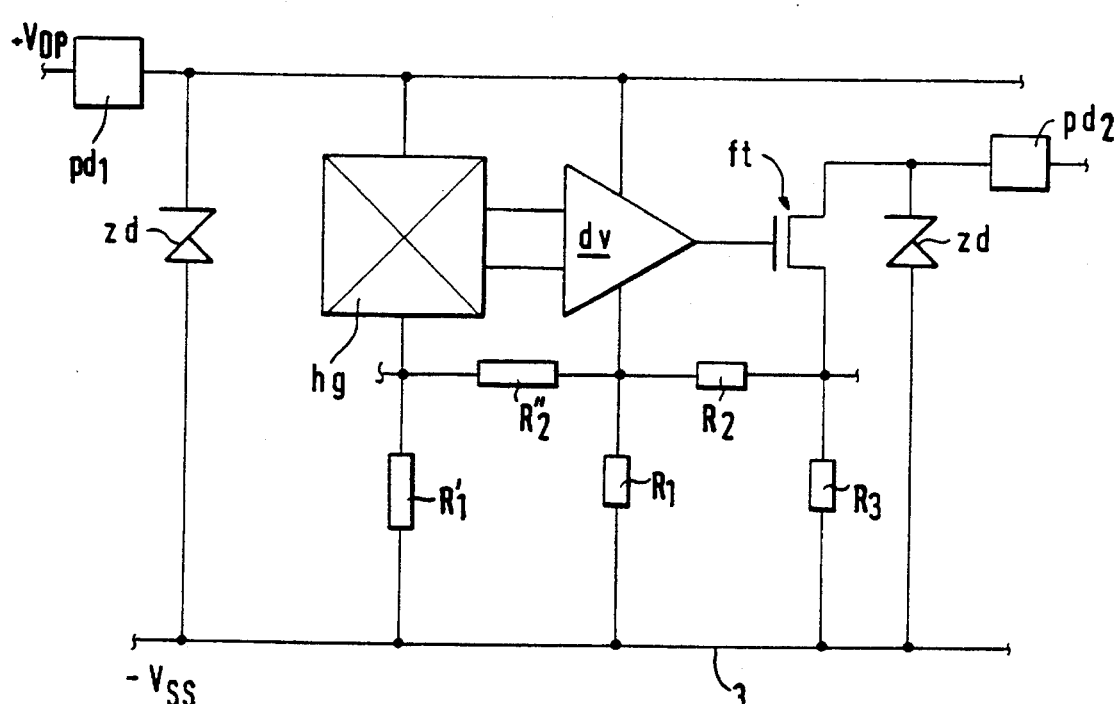
FIG. 2 shows the equivalent circuit of the arrangement of FIG. 1.

FIG. 2 shows the equivalent circuit of the arrangement of FIG. 1. The outputs of the Hall generator hg, which is connected to the supply voltage $V_{DD}$, are applied to differential amplifier dv, whose output is coupled to the gate of a field-effect transistor ft. The drain-source path of transistor ft is connected to the bonding pad $pd_2$ and via resistor $R_3$ to ground-$V_{SS}$. The junction of the source electrode and the resistor $R_3$ is connected to one end of the resistor $R_2$ whose other end is coupled to the control input of the differential amplifier dv which has a path to ground through the resistor $R_1$. The junction of $R_1$, $R_2$, and the control input of amplifier dv is connected to one end of resistor $R_2"$ whose other end is coupled to the bottom of Hall generator hg which has a path to ground through the resistor $R_1'$. Resistors $R_1$, $R_2$, $R_3$, $R_1'$, and $R_2''$ represent substrate resistances. To avoid cross coupling, the values of the substrate resistances must be chosen to fulfill the condition $R_2 \gg R_1$ and $R_3$, and $R_2'' \gg R_1'$ and $R_1$. There are two additional protective structures (protective diodes zd) inserted between the ground connection $-V_{SS}$ and the bonding pads $pd_1$ and $pd_2$.

Figure 3:
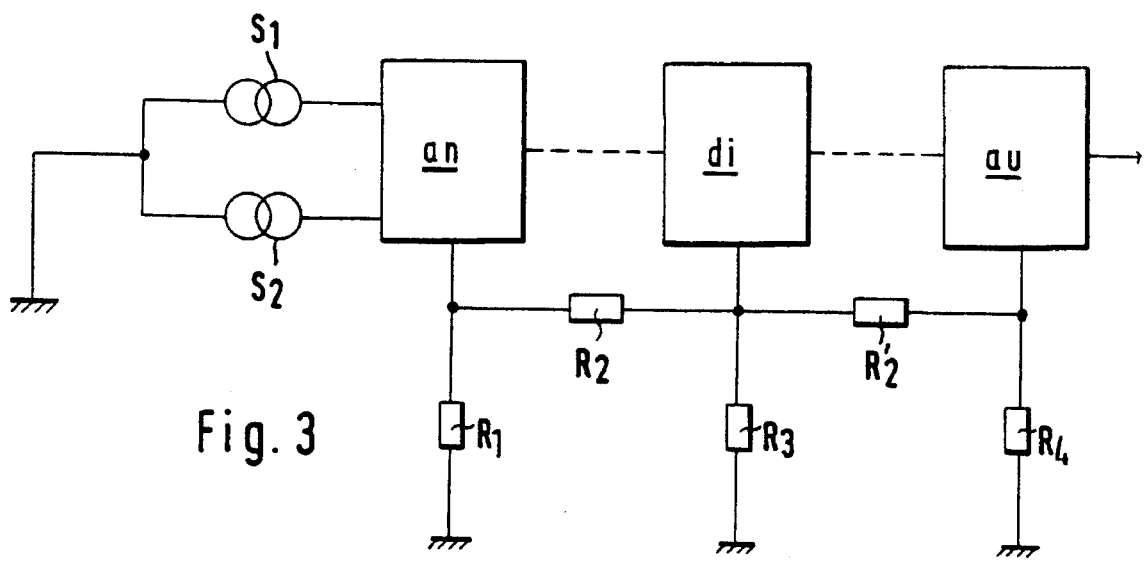
FIG. 3 shows the separation of the ground leads of the individual subcircuits.

FIG. 3 shows the general principle of the exemplary circuit of FIG. 2. The outputs of the two symmetrical signal sources $s_1$, $s_2$ are fed to an analog portion an, which is followed by a digital portion di and an output stage au. For the resistors shown, the same as in FIG. 2 applies analogously, i.e., the value of each of resistors $R_1$ and $R_3$ is less than that of $R_2$, and the value of each of resistors $R_3$ and $R_4$ is less than that of $R_2'$.

Figure 4:
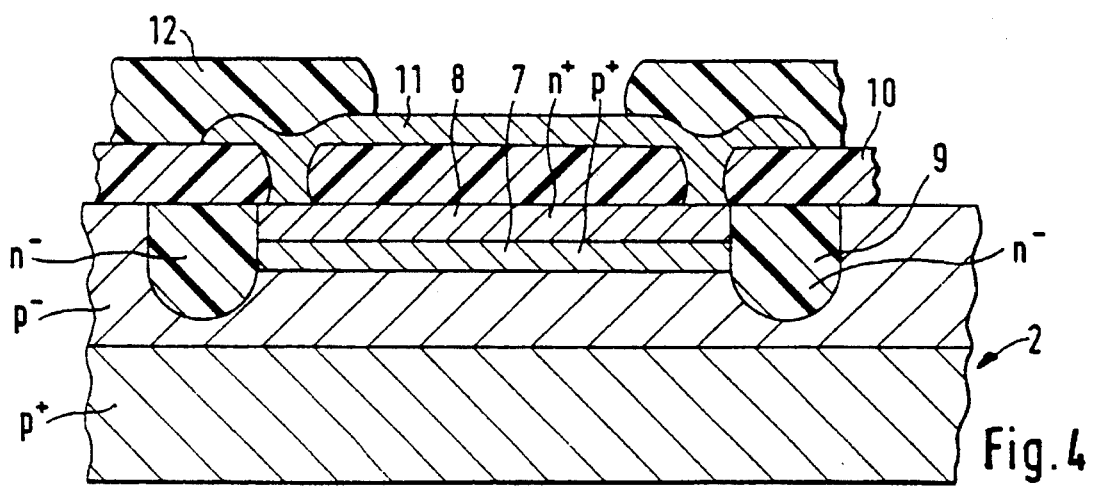
FIG. 4 shows the implementation of a protective structure.

FIG. 4 shows by way of example a section through the structure of protective diode zd. Since the present sensor may well be used in a vehicle, the protective structures should protect against the low gate breakdown voltage of CMOS devices. Thus a very accurate zener diode with a low serial resistance is needed, especially in the application in the vehicular environment where voltages can rise up to 24 V.

Therefore, electrical noise above 24 V must be protected by a zener diode. Gate breakdown can occur over 30 V and thus the zener diodes zd only have a small practical voltage range to work within this application. Since the Hall voltage of the Hall device hg is in the range of a few mV, noise from switching circuit on the chip can cause improper switching in the event that there is no electrical isolation between the digital and analog parts.

Therefore, the structure of the zener diode is important.

A p-type substrate 2 is heavily doped (p+) at its bottom side to reduce the contact resistance. From the top side of the substrate 2, a heavily doped layer 7 of the same conductivity type as the substrate 2 and then a heavily doped layer 8 of the opposite conductivity type are formed into the substrate 2. These two layers 7, 8 are surrounded by a lightly doped n-type insulating region 9. The surface of the substrate is covered by an insulating layer 10, which contains contact holes for the aluminum interconnection layer 11 which lead to the layer 8. As is conventional, a second insulating layer 12 is disposed on the interconnection layer.

The zener diode is a buried zener diode having the advantage of a stable zener diode which does not suffer changes of the zener-breakdown voltages caused by surface effects.

Region 9 is formed by well diffusion, the breakdown voltage of it is more than 100 V using CMOS-technique. All other junctions are channel junctions and have breakdown voltage lower than 20 V because of their edge curvature. Therefore, the structure is capable of producing stable zener diodes in CMOS with a breakdown voltage higher than 10 V.

Figure 5:
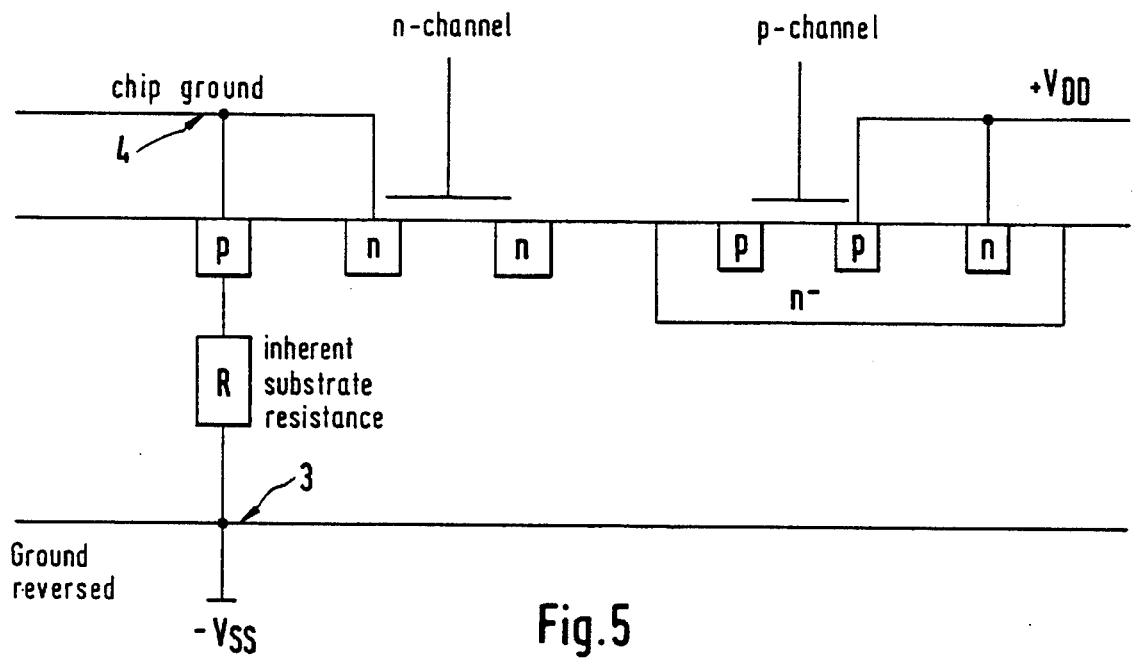
FIG. 5 shows the structure of a CMOS device to illustrate the solution to latch-up.
Figure 6:
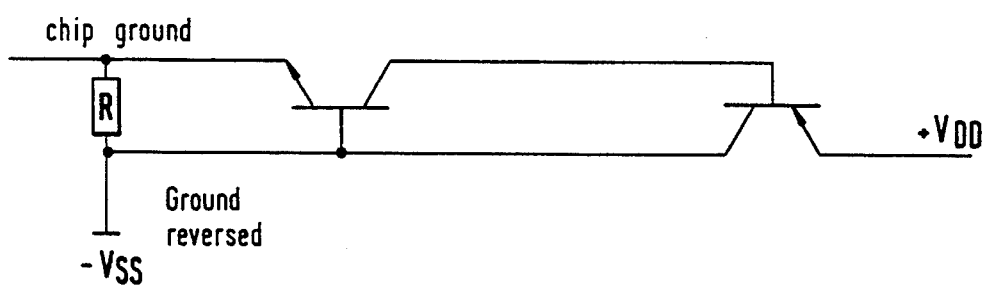
FIG. 6 shows the equivalent circuit of the structure of FIG. 5.

With reference to FIGS. 5 and 6, latching in CMOS occurs in a thyristor device comprising an n-channel and a p-channel transistor. The cathode of the thyristor is usually grounded on the surface of a chip and the gate of the thyristor is represented by the substrate. If only the substrate is connected on the reverse side of the chip, the current of the thyristor flows from the surface to the reversed side of the chip causing a voltage drop which turns the thyristor off. The structure and equivalent circuit of FIGS. 5 and 6 illustrate the construction and connections which solve this problem.

As mentioned earlier, the semiconductor chip 1 (FIG. 1) has the back of its substrate conductively attached to the ground connection 3. Connecting the ground to the reversed side of the chip has two advantages: first, one can save bond pad area at the top of the chip; and second, ground current flows to the resistors $R_1/R_3$ causing a voltage drop that stops any latching at high temperatures. A voltage drop is necessary and intended, so that the thyristor is turned off, and by this, latching is avoided. The current consumed by the circuit flows via the substrate resistance, and the voltage drop caused by this current should be kept lower than 200 mV.

Having disclosed the invention in connection with a preferred embodiments, modification may now suggest itself to those skilled in the art. The invention is not to be limited to the disclosed embodiments except as required by the appended claims.

I claim:

1. A sensor circuit implemented by CMOS devices on a top surface of a substrate of a semiconductor chip, said sensor circuit comprising:

a ground connection coupled to a bottom surface of said substrate; and input signal means on said substrate, said input signal means including an analog portion and a digital portion, said analog portion being coupled to said ground connection via a substrate resistance $R_1$, said digital portion being coupled to said ground connection via a substrate resistance $R_3$, said analog and digital portions also being connected together via a substrate resistance $R_2$, $R_2 > R_1$ and $R_2 > R_3$, wherein input signals applied at said input signal means are not referenced to said ground connection and wherein said input Signal means is ohmically coupled to said ground connection, such that, in use, a current flows between said input signal means and said ground connection preventing latching of the CMOS devices.

2. The sensor circuit of claim 1 wherein said input means further includes a zener diode for protecting gates of devices implementing said input means.

3. The sensor circuit of claim 2 wherein said zener diode is buried beneath the top surface of said substrate.

* * * * *